（12）United States Patent
Miyazawa et al.

(10) Patent No.: US 8,827,428 B2
(45) Date of Patent: Sep. 9, 2014

(54) PIEZOELECTRIC MOTOR, LIQUID EJECTING APPARATUS, AND CLOCK

(75) Inventors: Osamu Miyazawa, Shimosuwa-machi (JP); Yasuharu Hashimoto, Minamiminowa-mura (JP); Akihito Matsumoto, Chino (JP); Akira Matsuzawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 330 days.

(21) Appl. No.: 12/732,045

(22) Filed: Mar. 25, 2010

(65) Prior Publication Data

US 2010/0245517 A1    Sep. 30, 2010

(30) Foreign Application Priority Data

Mar. 26, 2009   (JP) ................................. 2009-077873

(51) Int. Cl.
| | |
|---|---|
| B41J 2/045 | (2006.01) |
| H01L 41/00 | (2013.01) |
| H02N 2/00 | (2006.01) |
| B41J 23/00 | (2006.01) |
| H01L 41/08 | (2006.01) |
| H02N 2/02 | (2006.01) |
| B41J 2/14 | (2006.01) |
| H01L 41/09 | (2006.01) |
| H02N 2/12 | (2006.01) |
| H02N 2/10 | (2006.01) |
| G04C 3/12 | (2006.01) |
| B41J 11/42 | (2006.01) |

(52) U.S. Cl.
CPC . *G04C 3/12* (2013.01); *B41J 23/00* (2013.01); *H01L 41/08* (2013.01); *B41J 11/42* (2013.01); *H02N 2/021* (2013.01); *B41J 2/14201* (2013.01); *H01L 41/0913* (2013.01); *H02N 2/026* (2013.01); *H02N 2/123* (2013.01); *H02N 2/0055* (2013.01); *H02N 2/103* (2013.01); *H02N 2/004* (2013.01)

USPC ... 347/68; 310/328; 310/323.01; 310/323.02; 310/323.16; 310/323.18

(58) Field of Classification Search
CPC ....... H02N 2/026; H02N 2/163; H02N 2/103; H02N 2/08; H02N 2/0065; H02N 2/025
USPC ......................................................... 310/328
See application file for complete search history.

(56) References Cited

U.S. PATENT DOCUMENTS 4,019,073 A  *  4/1977  Vishnevsky et al. ........... 310/322
5,073,739 A  *  12/1991  Iijima et al. ............... 310/323.02

(Continued)

FOREIGN PATENT DOCUMENTS

| CN | 1722600 A | 1/2006 |
| JP | 2004-248399 A | 9/2004 |

(Continued)

*Primary Examiner* — Laura Martin
*Assistant Examiner* — Leonard S Liang
(74) *Attorney, Agent, or Firm* — Kilpatrick Townsend & Stockton LLP

(57) ABSTRACT

A piezoelectric motor includes a piezoelectric element having a piezoelectric layer, and a first and a second electrodes, the first electrode provided on one surface side of the piezoelectric layer, and the second electrode provided on the other surface side of the piezoelectric layer; a piezoelectric actuator having a vibrating member anchored to the first electrode of the piezoelectric element; and a rotational shaft with which the vibrating member makes contact and is rotated thereby. The piezoelectric layer includes a vertical vibration excitation region, provided toward the center of the piezoelectric layer in the widthwise direction, that elicits vertical vibrations, and two groups of bending vibration excitation regions, one group disposed on either side of the vertical vibration excitation region so that two opposing diagonal pairs are formed; and the polarization direction of the vertical vibration excitation region and one of the groups of the bending vibration excitation regions in the piezoelectric layer is inverted relative to the other group of the bending vibration excitation regions.

13 Claims, 10 Drawing Sheets

(56) References Cited

U.S. PATENT DOCUMENTS

| | | | |
|---|---|---|---|
| 5,585,011 A * | 12/1996 | Saaski et al. .................... 216/2 |
| 5,886,722 A * | 3/1999 | Kuehnle ........................ 347/104 |
| 6,396,194 B1 * | 5/2002 | Iino et al. ................. 310/323.16 |
| 6,825,592 B2 * | 11/2004 | Magnussen et al. ..... 310/323.02 |
| 7,116,037 B2 * | 10/2006 | Moteki et al. ............ 310/323.02 |
| 7,119,476 B2 * | 10/2006 | Nagahama .................... 310/317 |
| 7,187,104 B2 * | 3/2007 | Yamamoto et al. ....... 310/323.02 |
| 7,193,353 B2 * | 3/2007 | Miyazawa .................... 310/328 |
| 7,378,777 B2 * | 5/2008 | Moteki et al. ............ 310/323.16 |
| 7,586,237 B2 * | 9/2009 | Hashimoto ............. 310/323.02 |
| 7,642,697 B2 | 1/2010 | Iino et al. |
| 7,786,648 B2 * | 8/2010 | Xu et al. ...................... 310/317 |
| 7,932,661 B2 * | 4/2011 | Ando et al. .............. 310/323.16 |
| 2002/0003384 A1 * | 1/2002 | Iino et al. ................ 310/316.02 |
| 2002/0036445 A1 * | 3/2002 | Iino et al. ................ 310/323.16 |
| 2002/0038987 A1 * | 4/2002 | Magnussen et al. ..... 310/323.16 |
| 2004/0080243 A1 * | 4/2004 | Miyazawa .................... 310/328 |
| 2004/0256956 A1 * | 12/2004 | Miyazawa .................... 310/328 |
| 2004/0256957 A1 * | 12/2004 | Miyazawa .................... 310/328 |
| 2005/0212386 A1 * | 9/2005 | Miyazawa .................... 310/328 |
| 2006/0175929 A1 * | 8/2006 | Sawada et al. ................ 310/312 |
| 2006/0175930 A1 * | 8/2006 | Ganor et al. .................. 310/317 |
| 2006/0181179 A1 * | 8/2006 | Wood et al. ................... 310/367 |
| 2007/0188048 A1 * | 8/2007 | Nagahama et al. ...... 310/316.01 |
| 2007/0188050 A1 * | 8/2007 | Hashimoto ............. 310/323.02 |
| 2007/0228875 A1 | 10/2007 | Miyazawa |
| 2008/0048526 A1 * | 2/2008 | Namerikawa et al. ... 310/323.02 |
| 2009/0009109 A1 * | 1/2009 | Hashimoto .................... 318/116 |
| 2009/0021111 A1 * | 1/2009 | Ue ................................ 310/317 |
| 2010/0072858 A1 * | 3/2010 | Ando et al. ............. 310/323.16 |

FOREIGN PATENT DOCUMENTS

| | | |
|---|---|---|
| JP | 2007-267482 A | 10/2007 |
| JP | 2007-330036 A | 12/2007 |

* cited by examiner

PIEZOELECTRIC MOTOR, LIQUID EJECTING APPARATUS, AND CLOCK

CROSS-REFERENCE TO RELATED APPLICATIONS

This application claims the benefit of priority to Japanese Patent Application No. 2009-077873 filed Mar. 26, 2009, the contents of which are hereby incorporated by reference in their entirety.

BACKGROUND

1. Technical Field

The present invention relates to a piezoelectric motor that uses a piezoelectric element to drive a unit that is to be driven, a liquid ejecting apparatus using the piezoelectric motor, and a clock using the piezoelectric motor.

2. Related Art

A piezoelectric motor is a device that rotationally drives a rotating shaft using a piezoelectric actuator provided with a piezoelectric element. Here, the piezoelectric actuator used in the piezoelectric motor is provided with a vibrating member and a piezoelectric element held on one of the surfaces of the vibrating member. The piezoelectric element of which the piezoelectric actuator is configured has two electrodes sandwiching the piezoelectric layer.

Here, the piezoelectric layer is provided with a longitudinal vibration excitation region that elicits vertical vibrations in the piezoelectric element and a bending vibration excitation region that elicits bending vibrations in the piezoelectric element (for example, see JP-A-2007-267482).

The longitudinal vibration excitation region is provided toward the center of the piezoelectric layer in the widthwise direction, whereas two groups of bending vibration excitation regions are provided as pairs on either side of the longitudinal vibration excitation region, with one member of each pair being disposed on either side of the longitudinal vibration excitation region so as to be located diagonally opposite to the other member of the pair. Longitudinal vibration is performed by the piezoelectric actuator causing longitudinal vibration through the expansion/constriction of the longitudinal vibration excitation region in the longitudinal direction. Meanwhile, bending vibration is performed by the piezoelectric actuator repeating, in alternation, bending driving in which one pair of the bending vibration excitation regions is expanded while the other pair is constricted and bending driving in which the one pair of bending vibration excitation regions is constricted while the other pair is expanded. Repeating, in alternation, the longitudinal and bending vibrations results in driving that causes the ends of the piezoelectric element in the lengthwise direction to trace an elliptical orbit.

However, because the longitudinal vibration excitation region and bending vibration excitation region have in the past been formed by dividing a single electrode into five portions, there has been a problem in that there is a large number of wires to connect to the electrode, and thus a risk that the mass of the wiring may disturb the vibration of the piezoelectric element.

Furthermore, in the above-described configuration used in the past, multiple wires are connected to multiple electrodes, leading to an increase in the number of connection locations; thus there is a problem in that the vibration characteristics of the piezoelectric element will change due to heat, pressure, or the like arising during the connection process, making it difficult for the piezoelectric element to obtain uniform characteristics.

SUMMARY

It is an advantage of some aspects of the invention to provide a piezoelectric motor, liquid ejecting apparatus, and clock capable of improving the vibration characteristics of a piezoelectric element.

An aspect of the invention is to provide a piezoelectric motor including: a piezoelectric element having a piezoelectric layer, and a first and a second electrodes, the first electrode provided on one surface side of the piezoelectric layer, and the second electrode provided on the other side of the piezoelectric layer; a piezoelectric actuator having a vibrating member anchored to the first electrode of the piezoelectric element; and a rotational shaft with which the vibrating member makes contact and is rotated thereby. The piezoelectric layer has a longitudinal vibration excitation region, provided toward the center of the piezoelectric layer in the widthwise direction, that elicits longitudinal vibrations, and two groups of bending vibration excitation regions, one group disposed on either side of the longitudinal vibration excitation region so that two opposing diagonal pairs are formed; and the polarization direction of the longitudinal vibration excitation region and one of the groups of the bending vibration excitation regions in the piezoelectric layer is inverted relative to the other group of the bending vibration excitation regions.

According to this aspect, it is not necessary to divide one of the electrodes into multiple portions, as was necessary in the past, and thus the same electrical field may be applied to all of the bending vibration excitation regions. Accordingly, the number of wires connecting electrodes to each other, the number of wires connected to the exterior, and so on may be reduced. It is therefore possible to improve the displacement characteristics of the piezoelectric element without the vibrations of the piezoelectric element being disturbed by an increase in the number of wires connected to electrodes. Because the number of wires connected to the electrodes is reduced, it is also possible to suppress a change in the vibration characteristics of the piezoelectric element caused by heat, pressure, and the like applied when connecting the wires, enabling a piezoelectric element having uniform characteristics to be obtained. Reducing the number of wiring connections furthermore makes it possible to reduce costs.

Here, it is preferable for the second electrode portion to include bending vibration electrode portions provided in connection to each other in the two groups of bending vibration excitation regions, and a vertical vibration electrode portion provided on the longitudinal vibration excitation region. Accordingly, by linking the bending vibration electrode portions with each other in the two groups of bending vibration excitation regions in this manner, it is possible to reduce the number of wiring connections.

It is preferable for the bending vibration electrode portion to be linked at its ends in the lengthwise direction of the piezoelectric element. By linking the bending vibration electrode portion in regions that are unlikely to contribute to the vibration of the piezoelectric element in this manner, the number of wires to be connected to the bending vibration electrode portion may be reduced without harming the displacement characteristics of the piezoelectric element.

It is preferable for the first electrode to have a first polarization electrode portion and a second polarization electrode portion divided based on regions of the piezoelectric layer that have different polarization directions, and provided so as to be electrically conductive with those regions. Using the first polarization electrode portion and the second polarization electrode portion in this manner makes it possible to polarize the piezoelectric layer in different polarization directions for each region.

Furthermore, another aspect of the invention is to provide a liquid ejecting apparatus including the piezoelectric motor according to the aforementioned aspects. This aspect makes it possible to realize a reduced-size liquid ejection apparatus at a lower cost.

Here, it is preferable for the piezoelectric motor to be used as a paper supply unit for transporting an ejection target medium onto which a liquid is ejected. This makes it possible to realize a liquid ejecting apparatus capable of supplying paper in a stable manner.

Furthermore, another aspect of the invention is to provide a clock including the piezoelectric motor according to the aforementioned aspects. This aspect makes it possible to realize a reduced-size clock at a lower cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

The invention will be described in detail hereinafter based on embodiments.

First Embodiment

Figure 1:
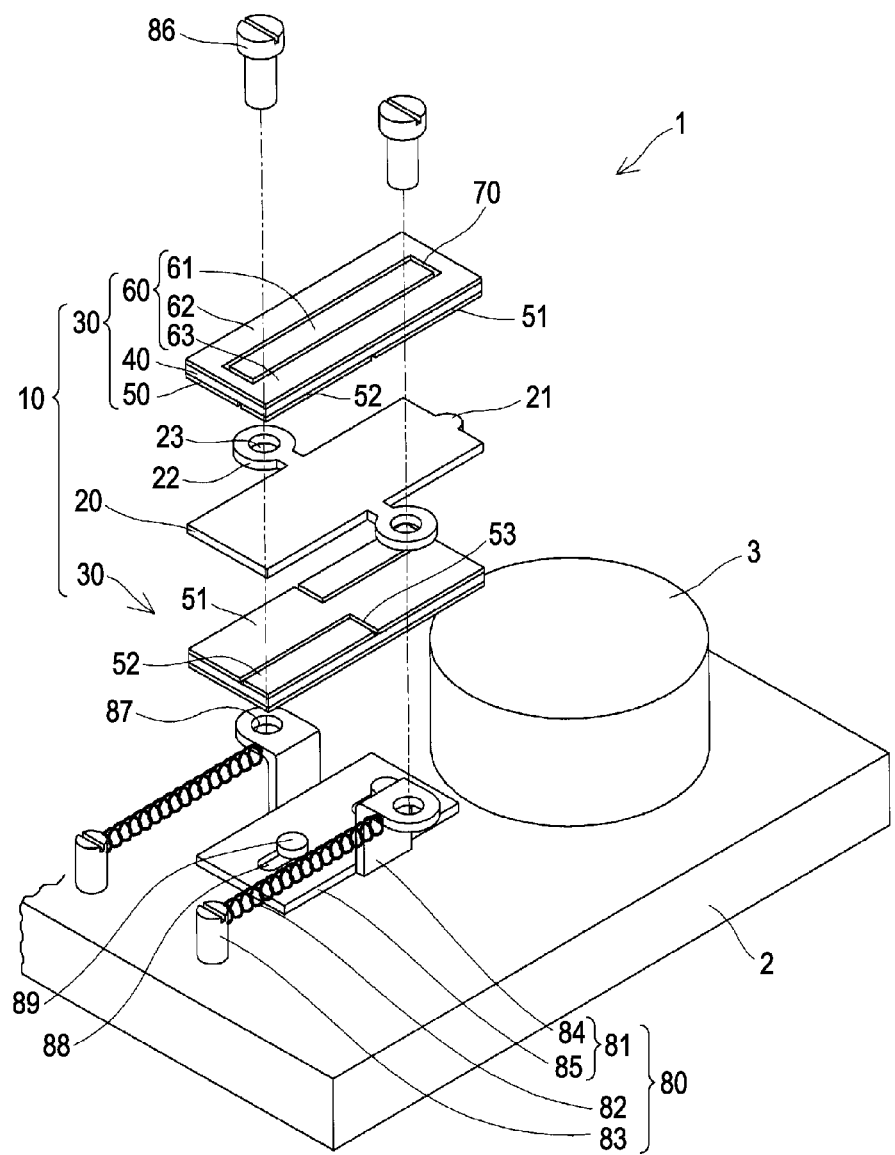
FIG. 1 is an exploded perspective view of a piezoelectric motor according to a first embodiment.
Figure 2:
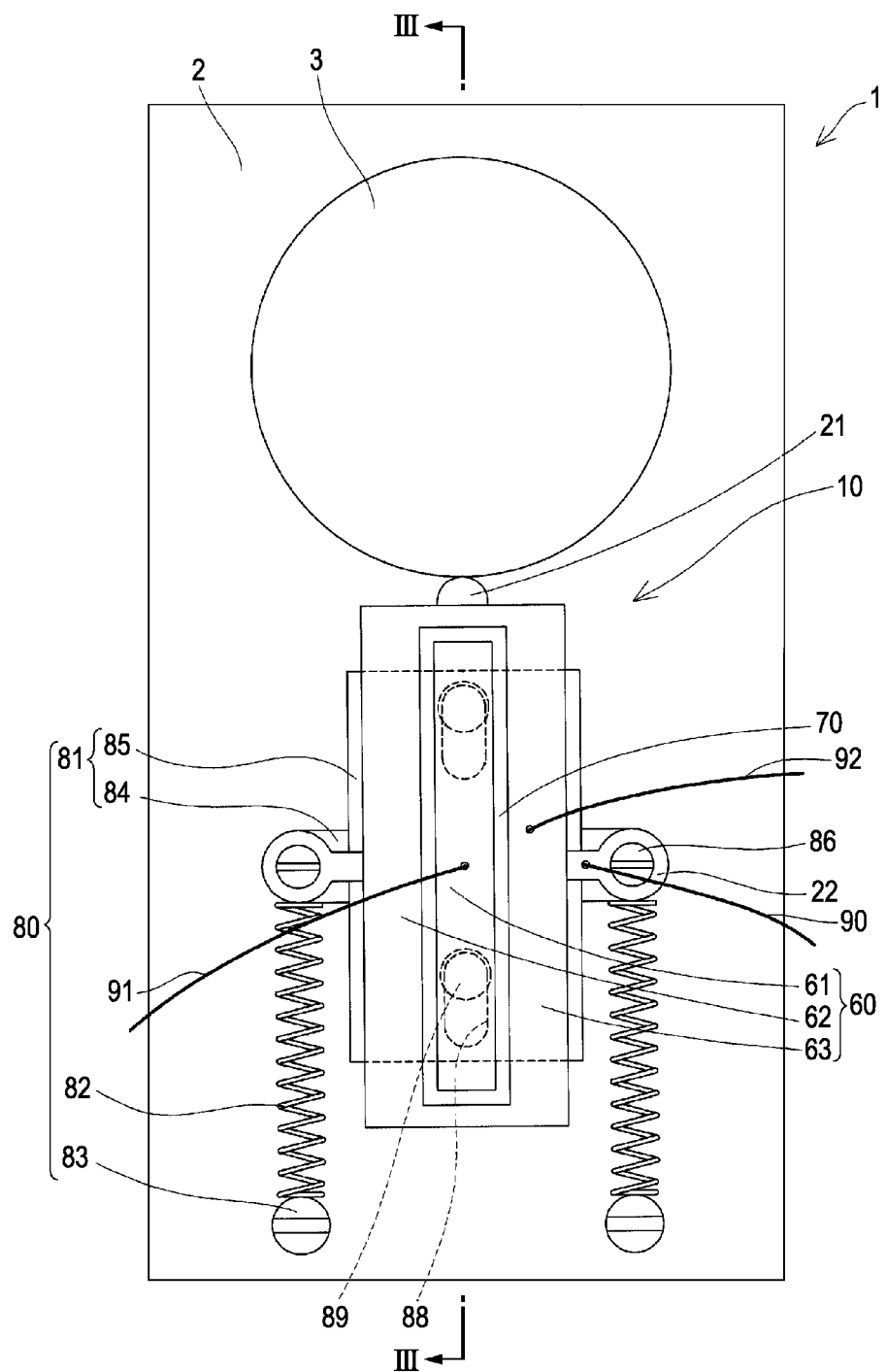
FIG. 2 is a plan view of the piezoelectric motor according to the first embodiment.
Figure 3:
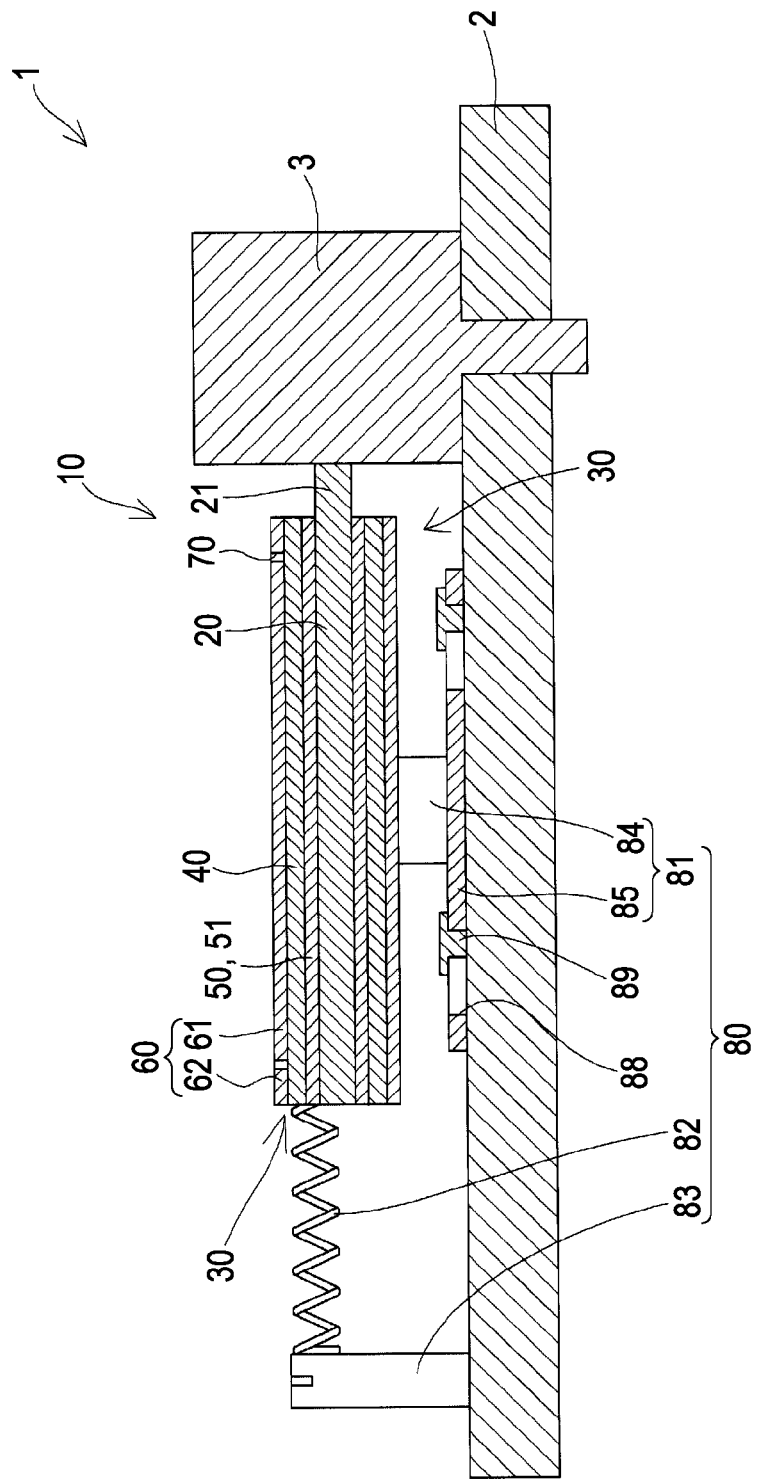
FIG. 3 is a cross-section of the piezoelectric motor according to the first embodiment.
Figure 4A:
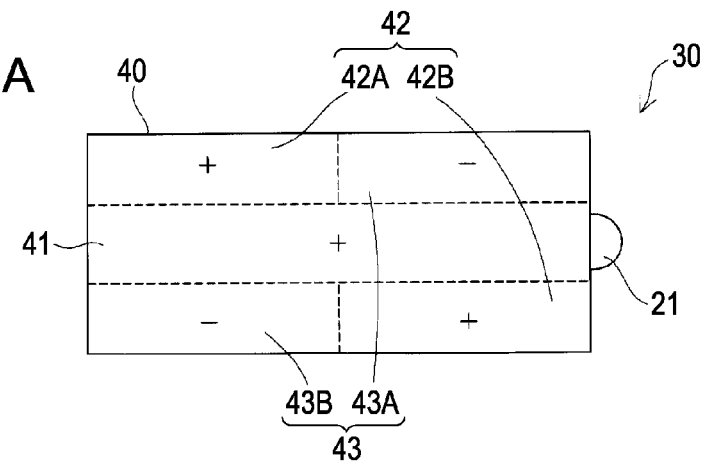
FIGS. 4A, 4B and 4C are plan views of the principal constituent elements of a piezoelectric actuator according to the first embodiment.
Figure 4B:
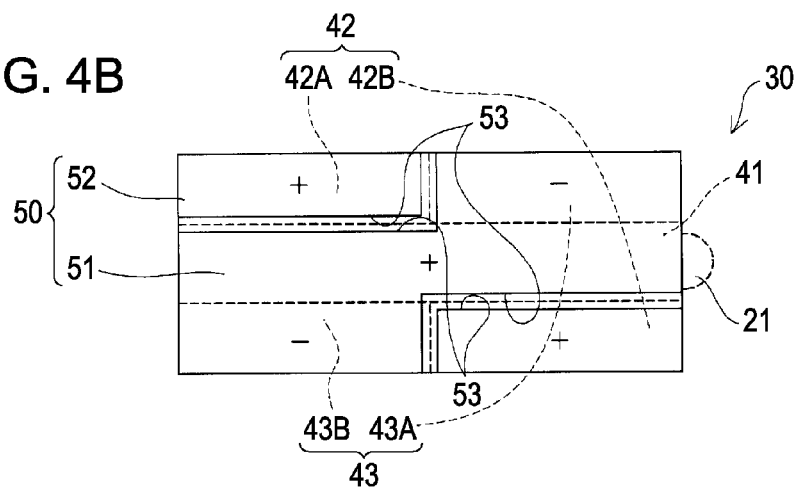
Figure 4C:
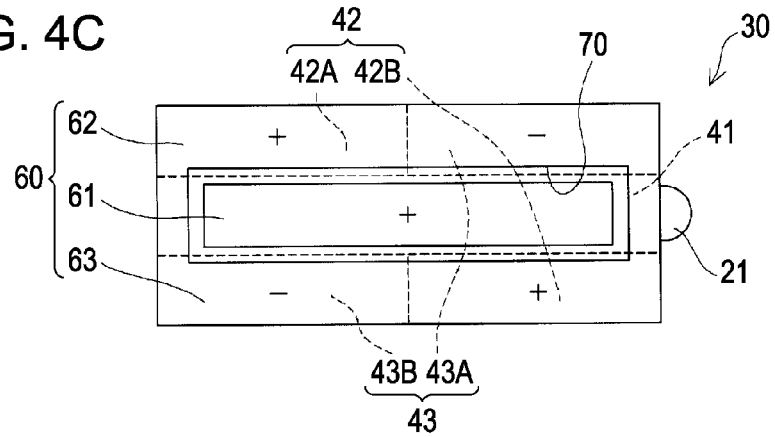

FIG. 1 is an exploded perspective view of a piezoelectric motor according to a first embodiment of the invention; FIG. 2 is a plan view of the piezoelectric motor; FIG. 3 is a cross-section viewed along the A-A' line shown in FIG. 2; and FIGS. 4A, 4B and 4C are plan views of the principal constituent elements of a piezoelectric actuator.

As shown in the diagrams, a piezoelectric actuator 10 of which a piezoelectric motor 1 according to this embodiment is configured is provided with a vibrating member 20 and piezoelectric elements 30 bonded to either side of the vibrating member 20.

The piezoelectric elements 30 provided on both sides of the vibrating member 20 each include a piezoelectric layer 40, a first electrode 50 provided on the side of the piezoelectric layer 40 that faces the vibrating member 20, and a second electrode 60 provided on the side of the piezoelectric layer 40 opposite the first electrode 50.

The piezoelectric layer 40 is configured of a piezoelectric material that exhibits electromechanical conversion effects, and in particular, a metal oxide having a Perovskite structure represented by general formula $ABO_3$. It is preferable to use, for example, a ferroelectric material such as lead zirconate titanate (PZT), a material obtained by adding a metal oxide such as niobium oxide, nickel oxide, magnesium oxide, or the like thereto, or the like as the piezoelectric layer 40. To be more specific, lead titanate ($PbTiO_3$), lead zirconate titanate ($Pb(Zr,Ti)O_3$), lead lanthanum titanate (($Pb,La)TiO_3$), lead lanthanum zirconate titanate (($Pb,La)(Zr,Ti)O_3$), lead magnesium niobate zirconium titanate ($Pb(Zr,Ti)(Mg,Nb)O_3$), or the like may be used. Of course, the piezoelectric layer 40 of this embodiment is not limited to the aforementioned materials, but a piezoelectric layer 40 that contains lead will have exceptional electromechanical conversion effects.

The piezoelectric layers 40 are divided, in the plane on which the second electrodes 60 are provided, into a longitudinal vibration excitation region 41 that elicits longitudinal vibrations in the piezoelectric element 30 and bending vibration excitation regions 42 and 43 that elicit bending vibrations in the piezoelectric element 30.

To be more specific, the piezoelectric layer 40 is divided approximately into thirds in the widthwise direction (specifically, the direction intersecting with the direction in which a contact portion 21 of the vibrating member 20 is provided; described later), and the longitudinal vibration excitation region 41 is provided in the center thereof, as shown in FIG. 4A. Furthermore, the bending vibration excitation regions 42 and 43 are provided on either side of the longitudinal vibration excitation region 41 in the widthwise direction of the piezoelectric elements 30, and are provided as two groups (that is, two pairs) so that regions obtained by dividing the bending vibration excitation regions in half in the lengthwise direction form pairs on the diagonal.

The piezoelectric layer 40 is so structured that the polarization direction of the longitudinal vibration excitation region 41 and one group of bending vibration excitation regions 42 and 43 is inverted relative to the other group of bending vibration excitation regions 42 and 43. In this embodiment, the longitudinal vibration excitation region 41 and the one group of bending vibration excitation regions 42 are polarized so as to be positive (+) on the side of the second electrode 60 and negative (−) on the side of the first electrode 50, whereas the other group of bending vibration excitation regions 43 is polarized so as to be negative (−) on the side of the second electrode 60 and positive (+) on the side of the first electrode 50.

The method for polarizing the piezoelectric layer 40 is not particularly limited, but in this embodiment, the first electrode 50 are divided into different regions in the polarization direction, and voltages are sequentially applied, in the mutually opposite directions, to the regions obtained by dividing the first electrode 50.

The first electrode 50 is, as shown in FIG. 4B, divided into a first polarization electrode portion 51, provided opposite to the longitudinal vibration excitation region 41 and the one group of bending vibration excitation regions 42 whose polarization directions are the same as the first polarization electrode portion 51, and second polarization electrode portions 52, provided opposite to the other group of bending vibration excitation regions 43 whose polarization directions are inverted relative to the first polarization electrode portion 51, with the electrode portions 51 and 52 separated from each other in the planar direction by polarization channels 53.

Meanwhile, the first electrode 50 is anchored to the vibrating member 20 as shown in FIG. 3. Here, by forming the vibrating member 20 from a conductive material, the first polarization electrode portion 51 and the second polarization electrode portion 52 are electrically conductive with each other via the vibrating member 20. Incidentally, even if the first electrode 50 and the vibrating member 20 are bonded to each other using an adhesive having insulating properties, the first polarization electrode portion 51 and the second polarization electrode portion 52 may be made electrically conductive with each other by pressing the first electrode 50 and the vibrating member 20 together and bonding the two to each other in such a state. Therefore, while the first polarization electrode portion 51 and the second polarization electrode portions 52 are separated from each other in the planar direction by the polarization channel 53, those electrode portions are electrically conductive with each other via the vibrating member 20. In other words, the vibrating member 20 of this embodiment functions as a common electrode causing the first electrodes 50 of the two piezoelectric elements 30 to be conductive with each other.

The piezoelectric layer 40 is thus polarized as described above using such a first polarization electrode portion 51 and second polarization electrode portions 52. In other words, two regions with different polarization directions can be easily formed in the piezoelectric layer 40 by, for example, performing a polarization process by applying a voltage in one direction between the first polarization electrode portion 51 and the second electrode 60, and then perform a polarization processed by applying a voltage in the opposite direction between the second polarization electrode portions 52 and the second electrode 60, when polarizing the piezoelectric element 30 prior to the bonding with the vibrating member 20.

Note that although the first polarization electrode portion 51 and the second polarization electrode portions 52 are provided in the first electrode 50 in this embodiment, the invention is not particularly limited thereto; for example, the first polarization electrode portion 51 and the second polarization electrode portions 52 may be removed after polarizing the piezoelectric layer 40 using the first polarization electrode portion 51 and the second polarization electrode portions 52, thereby forming a first electrode that has not been divided anew.

The second electrode 60 is provided on the side of the piezoelectric layer 40 opposite to the first electrode 50, and as shown in FIG. 4C, has a channel portion 70 that divides its surface along the longitudinal vibration excitation region 41 and the bending vibration excitation regions 42 and 43 provided on either side of the longitudinal vibration excitation region 41 of the piezoelectric layer 40, in the widthwise direction of the piezoelectric element 30. The channel portion 70 is provided along the border lines between the longitudinal vibration excitation region 41 and the bending vibration excitation regions 42 and 43 provided on either side of the longitudinal vibration excitation region 41 of the piezoelectric layer 40, in the widthwise direction of the piezoelectric element 30. Accordingly, the second electrode 60 is configured of 3 electrode portions 61 to 63, or in other words, a longitudinal vibration electrode portion 61 provided corresponding to the longitudinal vibration excitation region 41 of the piezoelectric layer 40, and first and second bending vibration electrode portions 62 and 63 provided corresponding to the bending vibration excitation regions 42 and 43, respectively, provided on either side of the longitudinal vibration excitation region 41 in the widthwise direction. The first bending vibration electrode portion 62 is provided on one side of the longitudinal vibration excitation region 41 in the widthwise direction, and is provided spanning across one of the two regions 42A of which the bending vibration excitation region 42 is configured and one of the two regions 43A of which the bending vibration excitation region 43 is configured. Meanwhile, the second bending vibration electrode portion 62 is provided on the other side of the longitudinal vibration excitation region 41 in the widthwise direction, and is provided spanning across the other of the two regions 42B of which the bending vibration excitation region 42 is configured and the other of the two regions 43B of which the bending vibration excitation region 43 is configured. Furthermore, the first bending vibration electrode portion 62 and the second bending vibration electrode portion 63 provided on the respective sides of the longitudinal vibration electrode portion 61 in the widthwise direction are provided so as to be linked to each other at both end portions of the longitudinal vibration electrode portion 61 in the lengthwise direction. In other words, the first bending vibration electrode portion 62 and the second bending vibration electrode portion 63 are provided so as to be linked both physically and electrically in the same plane. Accordingly, the aforementioned channel portion 70 is provided in a rectangular shape in the surface of the second electrode 60, with the longitudinal vibration electrode portion 61 being defined within the rectangular-shaped channel portion 70, and the first bending vibration electrode portion 62 and the second bending vibration electrode portion 63 being defined integrally outside of the channel portion 70.

Incidentally, both end portions of the piezoelectric element 30 in the lengthwise direction are inactive regions that for the most part do not contribute to the vibration of the piezoelectric element 30, and therefore the vibration characteristics of the piezoelectric element 30 do not decrease even if the first bending vibration electrode portion 62 and the second bending vibration electrode portion 63 are provided so as to be linked at the end portions of the longitudinal vibration electrode portion 61 in the lengthwise direction.

With a second electrode 60 configured in this manner, the first and second bending vibration electrode portions 62 and 63 are linked, and therefore the same driving signal is applied to both the first and second bending vibration electrode portions 62 and 63. Through this, a voltage of the same direction (electric field) is applied at the same timing to the two groups of bending vibration excitation regions 42 and 43 in the piezoelectric layer 40. However, because the polarization directions between the one group of bending vibration excitation regions 42 and the other group of bending vibration excitation regions 43 are inverted, the deformation of the two groups of bending vibration excitation regions 42 and 43 are similarly inverted. In other words, even if an electric field of the same direction is applied to the two groups of bending vibration excitation regions 42 and 43, one group of bending vibration excitation regions 42 will expand, while the other group of bending vibration excitation regions 43 will constrict. Furthermore, if the direction of the applied electric field is inverted, the expansion/constriction of the two groups of bending vibration excitation regions 42 and 43 will invert as well. In other words, one group of bending vibration excitation regions 42 will constrict, while the other group of bending vibration excitation regions 43 will expand.

It is thus possible to cause the piezoelectric element 30 to bend in an S-shape or an inverted S-shape by causing the two groups of bending vibration excitation regions 42 and 43, which make up pairs located on the diagonal on either side of the longitudinal vibration excitation region 41 in the piezoelectric layer 40, to expand or constrict, respectively.

Note that a highly-conductive material, such as a metal including gold (Au), platinum (Pt), iridium (Ir), or the like, may be used for the first electrode 50 and the second electrode 60. Furthermore, a tightening layer that improves the tightness between the first and second electrodes 50 and 60 and the piezoelectric layer 40 may be provided on the first electrode 50 and the second electrode 60.

In addition, as shown in FIG. 1, the vibrating member 20 has the same surface shape as the aforementioned first electrode 50 of the piezoelectric element 30, but is also provided with the contact portion 21 at one end in the lengthwise direction, extending so as to protrude beyond the piezoelectric element 30. Furthermore, a pair of arm portions 22 is provided in the central area of the vibrating member 20 in the lengthwise direction of the piezoelectric element 30, extending outward on either side in the widthwise direction of the piezoelectric element 30. Through-holes 23 are provided in the arm portions 22 so as to create an opening in the thickness direction thereof, and the vibrating member 20 is anchored to a holding member 81, described in detail later, via screw members 86 that have been passed through the through-holes 23. In other words, anchoring the piezoelectric actuator 10 to the holding member 81 via the arm portions 22 of the vibrating member 20 holds the piezoelectric element 30 on the holding member 81 in a state capable of longitudinal and bending vibrations central to the arm portions 22.

Figure 5A:
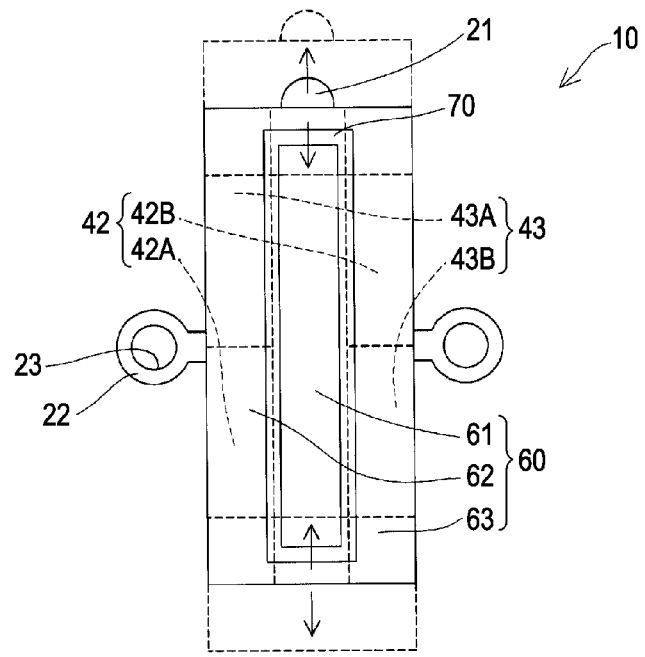
FIGS. 5A, 5B and 5C are plan views indicating operations of the piezoelectric actuator according to the first embodiment.

With such a piezoelectric actuator 10, the piezoelectric element 30 is driven so that the longitudinal vibration excitation region 41 and the bending vibration excitation regions 42 and 43 execute longitudinal and bending vibrations, respectively, in the surface direction. In other words, as shown in FIG. 5A, the piezoelectric element 30 is driven longitudinally in the lengthwise direction by expanding/constricting the longitudinal vibration excitation region 41 in the longitudinal direction (lengthwise direction), in the surface direction of the vibrating member 20.

Figure 5B:
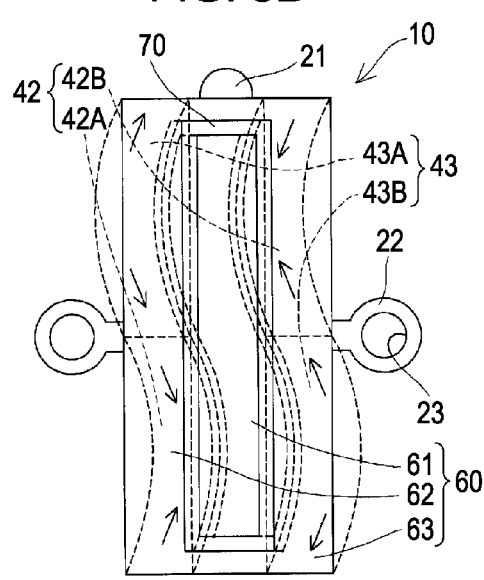
Figure 5C:
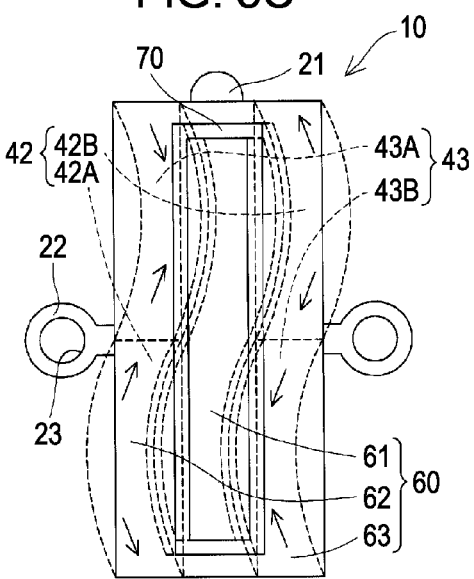

Furthermore, as shown in FIGS. 5B and 5C, the piezoelectric element 30 is driven so as to bend by expanding/constricting the bending vibration excitation regions 42 and 43 in the planar direction of the vibrating member 20. To be more specific, one of the groups of bending vibration excitation regions 42 whose members are opposite diagonally in the widthwise direction of the piezoelectric element 30 is caused to expand, while at the same time the other of the groups of bending vibration excitation regions 43 whose members are opposite diagonally is caused to constrict. Through this, the piezoelectric element 30 deforms into an S-shape as shown in FIG. 5B. Meanwhile, constricting the bending vibration excitation regions 42 that had been expanded and expanding the bending vibration excitation regions 43 that had been constricted causes the piezoelectric element 30 to bend in an inverse S-shape, as shown in FIG. 5C. By repeating, in alternation, the bending deformations illustrated in FIGS. 5B and 5C, the piezoelectric element 30 experiences bending vibration, from an S-shape to an inverted S-shape.

Figure 6:
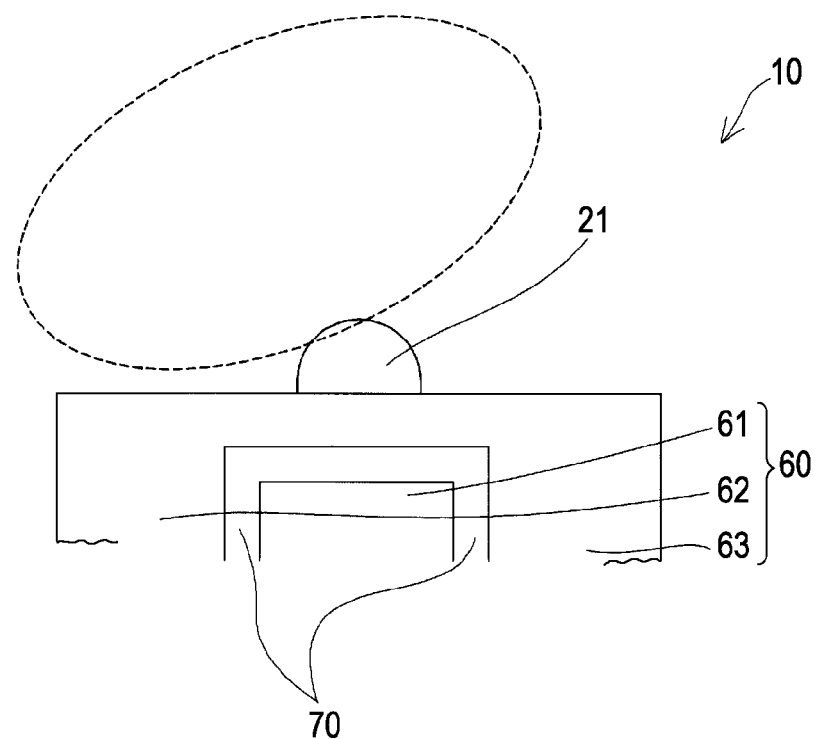
FIG. 6 is a plan view indicating operations of the piezoelectric actuator according to the first embodiment.

Causing the piezoelectric element 30 to repeatedly alternate between longitudinal vibration by the longitudinal vibration excitation region 41 and bending vibration by the bending vibration excitation regions 42 and 43 makes it possible, as shown in FIG. 6, for the end of the piezoelectric element 30 in the lengthwise direction, or in other words, for the contact portion 21 of the vibrating member 20, to be rotationally driven so as to trace an elliptical orbit. To be more specific, causing the piezoelectric element 30 to repeatedly deform so as to expand in the longitudinal (lengthwise) direction, bend into an S-shape, constrict in the longitudinal direction, and bend into an inverse S-shape in that sequence makes it possible to rotationally drive the contact portion 21 to trace an elliptical orbit in the clockwise direction in the same plane as the vibrating member 20. Furthermore, by switching the bending sequence when causing the piezoelectric element 30 to deform, the contact portion 21 can be rotationally driven so as to trace an elliptical orbit in the counterclockwise direction in the same plane as the vibrating member 20. Note that in this embodiment, piezoelectric elements 30 are provided on both sides of the vibrating member 20, and both of the piezoelectric elements 30 perform the same longitudinal and bending vibrations in the same plane as the vibrating member 20. In other words, the respective longitudinal vibration excitation regions 41 and bending vibration excitation regions 42 and 43 of the two piezoelectric elements 30 are disposed so as to overlap when viewing a plan view of the piezoelectric actuator 10 from the side of the second electrode 60 in one of the piezoelectric elements 30, and thus causing the same expansion/constriction in the regions that overlap when viewed as a plan view causes the vibrating member 20 to deform in the planar direction. Of course, causing the piezoelectric elements 30 disposed on either surface of the vibrating member 20 to experience different deformations makes it possible to perform driving that causes deformation in the lamination direction between the vibrating member 20 and the piezoelectric elements 30.

Note that the respective electrodes in the piezoelectric element 30 provided in the piezoelectric actuator 10 (that is, the first electrode 50 and the second electrode 60) have wires connected thereto for driving the piezoelectric element 30.

As shown in FIG. 3, the first electrode 50 is electrically connected to the vibrating member 20, and thus, as shown in FIG. 2, a common wire 90 is connected via the vibrating member 20.

In addition, as shown in FIG. 2, an individual longitudinal vibration wire 91 and two individual bending vibration wires 92 are connected to the longitudinal vibration electrode portion 61 and the first and second bending vibration electric portions 62 and 63, respectively, of which the second electrode 60 is configured. To be more specific, the common wire 90 is connected to the arm portion 22 of the vibrating member 20 in the piezoelectric actuator 10. Through this, the common wire 90 is electrically connected to the first electrode 50 via the vibrating member 20.

The individual longitudinal vibration wire 91 is connected to the central portion in the lengthwise direction of the longitudinal vibration electrode portion 61 in the second electrode 60. Meanwhile, the individual bending vibration wire 92 is connected to the central portion in the lengthwise direction of the first bending vibration electrode portion 62 in the second electrode 60. Note that connecting the individual longitudinal vibration wire 91 and the individual bending vibration wire 92 to the central portions in the lengthwise directions that serve as base points for the longitudinal and bending vibrations, respectively, of the piezoelectric element 30 suppresses the individual wires 91 and 92 from disconnecting, suppresses the individual wires 91 and 92 from disturbing the displacement of the piezoelectric element 30, and so on.

Note that because piezoelectric elements 30 are provided on either side of the vibrating member 20 in this embodiment, the individual wires 91 and 92 may be connected to each of the first electrodes 50 in the piezoelectric elements 30, or the longitudinal vibration electrode portions 61 and the bending vibration electrode portions 62 (63) within one piezoelectric element 30 may be connected to their counterparts in the other piezoelectric element 30 using connection wires or the like.

In this manner, reducing the number into which the second electrode 60 of the piezoelectric element 30 is divided by the channel portion 70 makes it possible to drive the piezoelectric element 30 simply by connecting the two individual wires 91 and 92 to the second electrode 60 of one of the piezoelectric elements 30. As opposed to this, with a piezoelectric element that, as in the past, employs a piezoelectric layer whose polarization direction is the same across the entire surface, the first electrode of one of the piezoelectric elements 30 is divided into a single longitudinal vibration electrode and four bending vibration electrodes, for a total of five electrodes. With such a piezoelectric element that has a second electrode divided into five portions, two connection wires are connected between the bending vibration electrodes opposite each other on the diagonal so that the wires cross each other, and thus with a single individual wire connected to the longitudinal vibration electrode, and one individual wire for each of the groups of bending vibration electrodes opposite each other on the diagonals, a total of three connections are necessary. In this manner, in the past, multiple wires have been connected to a piezoelectric element having a second electrode divided into multiple portions, and thus the mass of the wiring has disturbed the vibration of the piezoelectric element and caused a drop in the displacement characteristics. Furthermore, with this past configuration, there is a high number of locations for connecting the multiple wires, and thus the piezoelectric characteristics of the piezoelectric element will change due to heat, pressure, or the like applied during the connection process, making it impossible for the piezoelectric element to obtain uniform characteristics.

However, according to the invention, the number of wires 91 and 92 connected to the piezoelectric element 30 may be reduced, thereby making it possible to suppress a drop in the displacement characteristics of the piezoelectric element caused by the mass of the wires 91 and 92, as well as making it possible to suppress negative effects on the piezoelectric element 30 caused by the application of heat, pressure, and so on when connecting the wires 91 and 92; this makes it possible to achieve a piezoelectric element 30 that has uniform piezoelectric characteristics.

Furthermore, with past piezoelectric actuators whose second electrodes are divided into five portions, the individual vibration electrodes in the regions provided opposite to each other on either side of the longitudinal vibration electrode in the widthwise direction of the piezoelectric element are not pairs, and thus are not conductive; however, in this embodiment, the same driving waveform may be applied to the bending vibration electrodes on either side of the longitudinal vibration electrode, and thus the two bending vibration electrodes may be conductive relative to each other at the ends in the lengthwise direction of the longitudinal vibration electrode. This also makes connection wiring, or in other words, connection wiring that crosses over, unnecessary.

Furthermore, although the first and second bending vibration electrode portions 62 and 63 provided on either side of the longitudinal vibration electrode portion 61 are connected to each other in this embodiment, the invention is not particularly limited thereto, and individual wires may be connected to the first and second bending vibration electrode portions 62 and 63 respectively. In this case, there are three wires from the exterior, which is the same number as with the second electrode divided into five portions as in the past; however, the aforementioned effects may be achieved because the two crossing connection wires are unnecessary, which is different from the past technique.

Note that the method for connecting the wires 90 to 92 is not particularly limited, and if, for example, bonding wires are used as the wires 90 to 92, the wires can be connected through wire-bonding.

Meanwhile, as shown in FIG. 1 and FIG. 2, a rotational shaft 3 that can be rotated central to its axis is provided in the apparatus body 2. The rotational shaft 3 is rotated by causing the contact portion 21, which is rotationally driven by the piezoelectric actuator 10 so as to trace an elliptical orbit, to come into contact with the rotational shaft 3. In this embodiment, the contact portion 21 is caused to make contact with the surface of the rotational shaft 3 in the circumferential direction thereof so that the rotational direction in which the contact portion 21 of the piezoelectric actuator 10 traces an elliptical orbit is the direction opposite to the rotational direction of the rotational shaft 3. Of course, the contact portion 21 may be caused to make contact with the end surface of the rotational shaft 3.

Furthermore, the piezoelectric motor 1 is provided with a pressing unit 80 that presses the piezoelectric actuator 10 in the direction of the rotational shaft 3 at a predetermined pressure.

The pressing unit 80 includes the holding member 81 that holds the piezoelectric actuator 10; a spring member 82, such as a coil spring or the like, one end of which is anchored to the holding member 81; and an eccentric pin 83, making contact with the other end of the spring member 82 and being anchored to the apparatus body 2, for adjusting the bias of the spring member 82.

The holding member 81 includes a pair of anchoring portions 84 to which the arm portions 22 of the piezoelectric actuator 10 are anchored, and a slide portion 85, provided integrally between the anchoring portions 84, and supported so as to be capable of sliding relative to the apparatus body 2. Female screw portions 87, into which the screw members 86 are threaded, are formed in the anchoring portions 84, in positions corresponding to the through-holes 23 of the arm portions 22. The piezoelectric actuator 10 is held by the holding member 81 by threading the screw members 86 through the through-holes 23 of the arm portions 22 and into the female screw portions 87.

The slide portion 85 is provided with slide holes 88, which are long holes that pass through in the thickness direction and extend in the sliding direction. The slide portion 85 is supported by slide pins 89, which pass through the slide holes 88 and are anchored to the apparatus body 2, so as to be slidable relative to the apparatus body 2.

The spring member 82 is configured of a coil spring, and is disposed so that one end thereof is anchored to the anchoring portion 84 and the other end makes contact with the side surface of the eccentric pin 83, which is anchored so as to be eccentrically rotatable relative to the apparatus body 2. The spring member 82 is disposed along the sliding direction of the slide portion 85. This spring member 82 biases the piezoelectric actuator 10 against the apparatus body 2 in the direction of the rotational shaft 3. Incidentally, the eccentric pin 83 is provided so as to be eccentrically rotatable relative to the apparatus body 2, and thus the bias exerted by the spring member 82 may be adjusted by eccentrically rotating the eccentric pin 83, thereby changing the interval between the side surface of the eccentric pin 83 and the holding member 81.

Although a coil spring is used as the spring member 82 in this embodiment, it should be noted that the spring member 82 is not particularly limited thereto, and, for example, a plate spring or the like may be used as well.

The piezoelectric actuator 10 is pressed against the rotational shaft 3 at a predetermined pressure by this pressing unit 80, so that the lengthwise direction (vertical vibration direction) of the piezoelectric element 30 is central to the axis of the rotational shaft 3. In other words, the piezoelectric actuator 10 of this embodiment is disposed so that the lengthwise direction of the piezoelectric element 30 is the same as the radial direction of the rotational shaft 3, and is pressed in that radial direction toward the rotational shaft 3.

Then, as described above, the rotational shaft 3 is rotationally driven by driving the piezoelectric element 30 to alternate between longitudinal vibration and bending vibration, thereby rotating the contact portion 21 of the piezoelectric actuator 10 so as to trace an elliptical orbit, while the contact portion 21 is pressed toward the rotational shaft 3 by the pressing unit 80.

The number of rotations of the rotational shaft 3 rotated by the piezoelectric actuator 10 is greatly influenced by the vibration cycle of the longitudinal and bending vibrations, and the torque of the rotational shaft 3 is greatly influenced by the amount of pressure exerted on the rotational shaft 3 by the piezoelectric actuator 10 due to the pressing unit 80.

Figure 7:
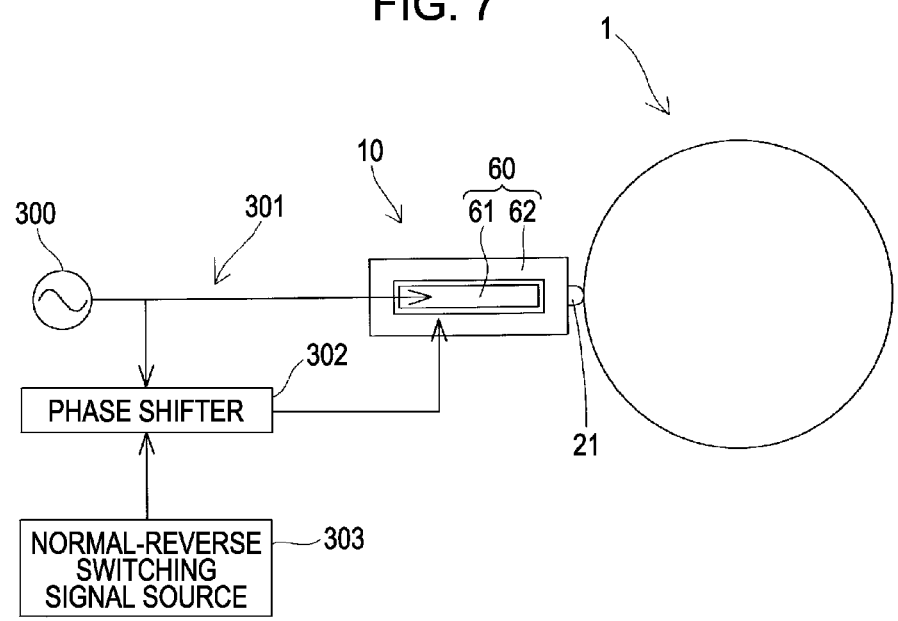
FIG. 7 is a diagram indicating a control system of the piezoelectric motor according to the first embodiment.

Here, a control system for the piezoelectric motor 1 according to this embodiment will be described with reference to FIG. 7. FIG. 7 is a block diagram illustrating a control system for a piezoelectric motor.

As shown in FIG. 7, a signal generation unit 300 generates a driving signal of a predetermined frequency and outputs that signal to a driver circuit 301. In this embodiment, an analog signal composed of an alternating voltage, a rectangular pulse digital signal, or the like may be used as the driving signal.

The driver circuit 301 includes a phase shifter 302. The phase shifter 302 has a function for delaying the phase of the driving signal from the signal generation unit 300 by 90 degrees. To be more specific, the phase shifter 302 generates a driving signal that causes a bending vibration whose phase is delayed by 90 degrees relative to the driving signal that causes the piezoelectric element 30 to vibrate longitudinally. The longitudinal vibration driving signal is applied to the longitudinal vibration electrode portion 61 of the second electrode 60 in the piezoelectric element 30, and the phase-delayed bending vibration driving signal is applied to the first and second bending vibration electrode portions 62 and 63 of the second electrode 60.

A normal-reverse switching signal source 303 that outputs a switching signal is connected to the phase shifter 302, and based on the switching signal from the normal-reverse switching signal source 303, the phase shifter 302 generates, as the bending vibration driving signal, a signal in which the phase of the longitudinal vibration driving signal has been advanced by 90 degrees. Shifting the phase of the bending vibration driving signal + or −90 degrees relative to the longitudinal vibration driving signal in this manner makes it possible to invert the direction of the elliptical orbit traced by the contact portion 21. The rotational direction of the rotational shaft 3 may therefore be controlled.

As described thus far, with the piezoelectric element 30 of the piezoelectric motor 1, mutually inverting the polarization direction of the two groups of bending vibration excitation regions 42 and 43 in the piezoelectric layer 40 makes it possible to apply the same bending vibration driving signal to two regions whose polarizations are different. Accordingly, only two types of driving signals for driving the piezoelectric motor 1 are necessary: a longitudinal vibration driving signal applied to the longitudinal vibration electrode portion 61, and a bending vibration driving signal applied to the first and second bending vibration electrode portions 62 and 63. It is therefore unnecessary to generate two types of bending vibration driving signals to be applied to the two bending vibration electrode portions, as was necessary in the past. Accordingly, with the invention, a phase inversion unit for inverting the phase of a single bending vibration driving signal is unnecessary, and thus the invention achieves effects in which the control system of the piezoelectric motor 1 may be simplified and the cost of the motor may be reduced.

Second Embodiment

Figure 8:
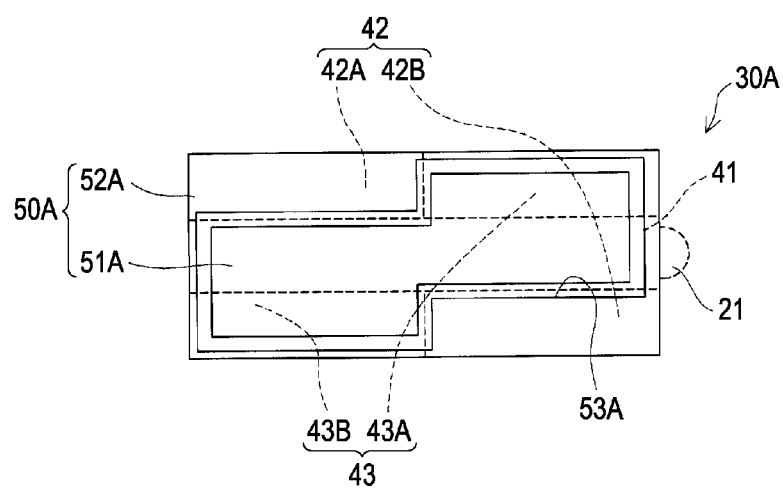
FIG. 8 is a plan view of the principal constituent elements of a piezoelectric actuator according to a second embodiment.

FIG. 8 is a plan view of the principal constituent elements of a piezoelectric actuator according to a second embodiment of the invention. Note that elements identical to those in the aforementioned first embodiment are given the same reference numerals, and redundant descriptions thereof will be omitted.

As shown in FIG. 8, with a piezoelectric element 30A provided in the piezoelectric actuator 10 of which the piezoelectric motor 1 according to this embodiment is configured, a first electrode 50A is divided into a first polarization electrode portion 51A and a second polarization electrode portion 52A, separated by a polarization channel portion 53A. The first polarization electrode portion 51A is provided with the longitudinal vibration excitation region 41 and one group of opposing bending vibration excitation regions 42 and 43 of the piezoelectric layer 40. Meanwhile, the second polarization electrode portion 52A is provided with the other group of opposing bending vibration excitation regions 42 and 43. In this embodiment, the first polarization electrode portion 51A is provided so as to oppose the longitudinal vibration excitation region 41 and the bending vibration excitation region 42, whereas the second polarization electrode portion 52A is provided so as to oppose the bending vibration excitation region 43. In other words, the second polarization electrode portion 52A is provided in a position that is opposite to the piezoelectric element 30A on the diagonal, whereas the first polarization electrode portion 51A is provided on the surface of the piezoelectric element 30A in what is approximately a Z-shape. Furthermore, the second polarization electrode portion 52A is provided so as to be linked at the end portions of the piezoelectric element 30A in the lengthwise direction.

By linking the second polarization electrode portion 52A within the same plane as the piezoelectric element 30A, it is possible to reduce the number of wires connected to the first electrode 50A when polarizing the piezoelectric layer 40; therefore, in addition to the effects of the aforementioned first embodiment, it is furthermore possible to suppress a reduction in the displacement characteristics of the piezoelectric element 30A caused by heat, pressure, and so on applied when connecting wires during the polarization.

Other Embodiments

Although exemplary embodiments of the invention have been described thus far, the basic configuration of the invention is not intended to be limited to the aforementioned descriptions. For example, although the first and second bending vibration electrode portions 62 and 63 of the second electrode 60 were described in the aforementioned first and second embodiments as being linked to each other, the invention is not particularly limited thereto, and for example, the first bending vibration electrode portion 62 and the second bending vibration electrode portion 63 may be provided in a non-connected state. In this case as well, the crossing connection wires used in the past are unnecessary, and thus the same effects as those described in the aforementioned first embodiment may be achieved.

In addition, although an example was described in which the piezoelectric actuator 10 has the piezoelectric elements 30 and 30A provided on the surfaces of the vibrating members 20 and 20A respectively, the invention is not particularly limited thereto, and the invention may still be applied even if the piezoelectric actuator 10 has the piezoelectric elements 30 and 30A provided on only one side of the vibrating member 20.

In addition, although the piezoelectric actuator 10 was described in the aforementioned first and second embodiments as been pressed toward the rotational shaft 3 by the pressing unit 80, the invention is not particularly limited thereto, and for example, the rotational shaft 3 may instead be pressed toward the piezoelectric actuator 10. Of course, the pressing unit 80 is not an absolutely necessary element.

Figure 9:
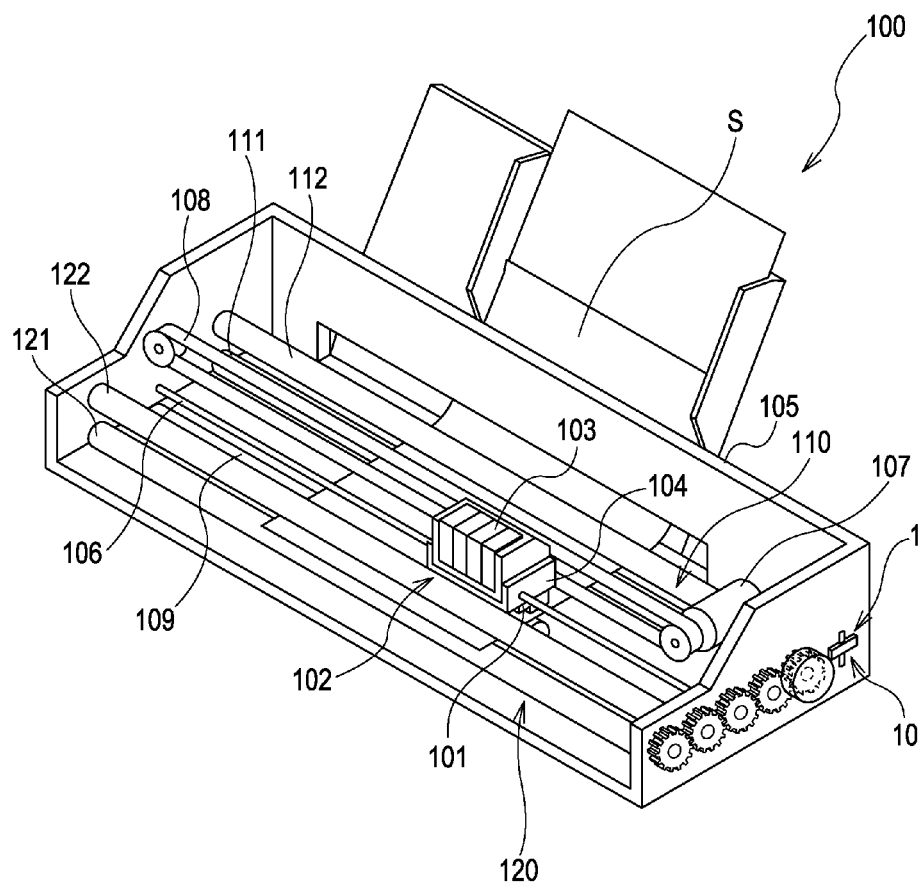
FIG. 9 is an overall perspective view of a recording apparatus according to an embodiment of the invention.
Figure 10:
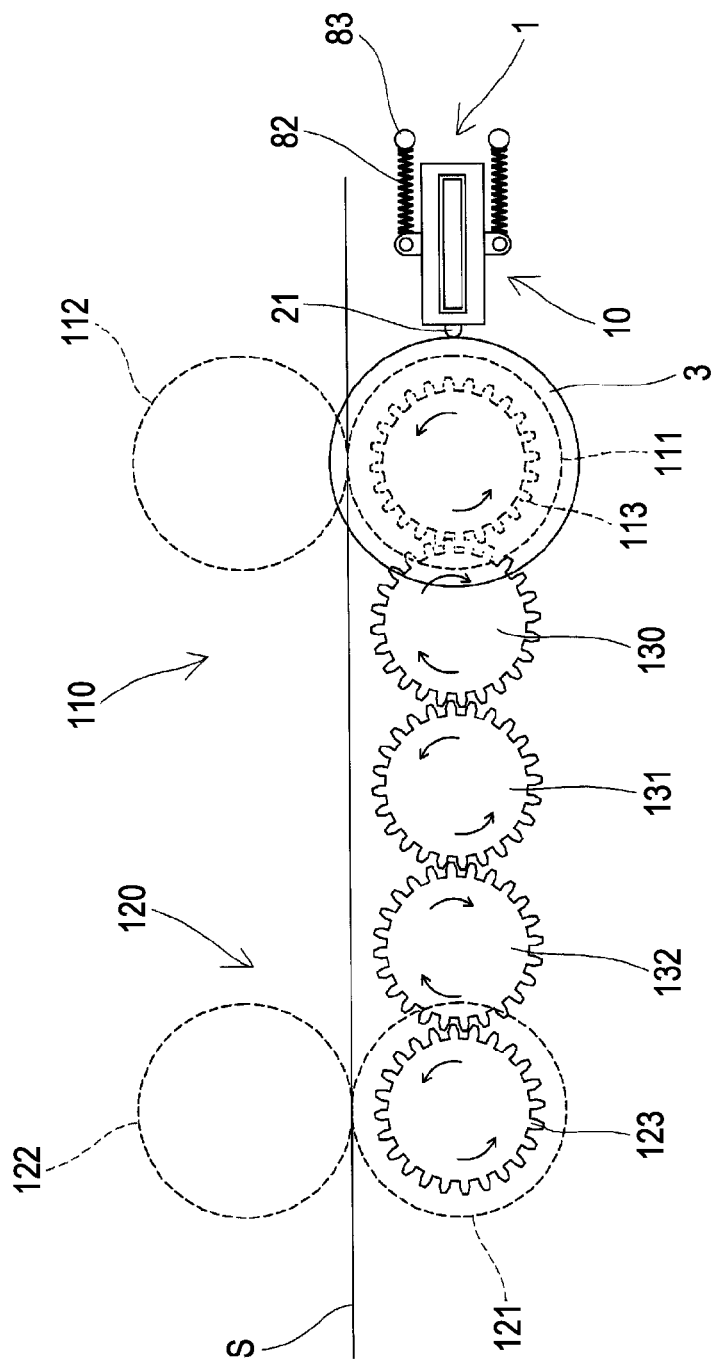
FIG. 10 is an enlarged plan view of the principal constituent elements of a recording apparatus according to an embodiment of the invention.

In addition, the piezoelectric motor 1 described in the aforementioned embodiments may be used as a driving unit in an ink jet recording apparatus, which is an example of a liquid ejecting apparatus. Here, an example of an ink jet recording apparatus that uses the piezoelectric motor 1 according to the first embodiment is illustrated in FIG. 9 and FIG. 10. FIG. 9 is an overall perspective view of an ink jet recording apparatus serving as an example of a liquid ejecting apparatus according to an embodiment, whereas FIG. 10 is a plan view illustrating an enlarged view of the principal constituent elements thereof.

In an ink jet recording apparatus 100 illustrated in FIG. 9, a recording head unit 102 having an ink jet recording head 101 that discharges ink is provided with a removable cartridge 103 that corresponds to an ink supply unit; a carriage 104 in which the recording head unit 102 is installed is provided so as to be mobile in the axial direction of a carriage shaft 106 attached to a recording apparatus housing 105. This recording head unit 102 discharges, for example, black ink compounds and color ink compounds.

Transmitting driving force generated by a driving motor 107 to the carriage 104 via multiple gears (not shown) and a timing belt 108 moves the carriage 104, in which the recording head unit 102 is installed, along the carriage shaft 106. Meanwhile, a platen 109 is provided in the recording apparatus housing 105 along the carriage shaft 106, and a recording sheet S, which is an ejection target medium such as paper supplied by a paper supply unit 110, is wound and transported by the platen 109. The recording sheet S is printed by ink discharged from the ink jet recording head 101 upon the platen 109. The recording sheet S that has been printed upon the platen 109 is then discharged by a discharge unit 120 provided on the side of the platen 109 opposite to the paper supply unit 110.

As shown in FIG. 10, the paper supply unit 110 is configured of a paper supply roller 111 and a slave roller 112. The rotational shaft 3 of the aforementioned piezoelectric motor 1 is anchored to the end of the paper supply roller 111, and is rotationally driven by the driving of the piezoelectric actuator 10. Furthermore, the paper supply roller 111 is provided with a first gear 113 upon its axis.

The discharge unit 120 is configured of a discharge roller 121 and a slave roller 122. The discharge roller 121 is provided with a second gear 123 upon its axis. The first gear 113 of the paper supply roller 111 engages with the second gear 123 of the discharge roller 121 via a third gear 130 that engages with the first gear 113, a fourth gear 131 that engages with the third gear 130, and a fifth gear 132 that engages with the fourth gear 131; thus the driving force of the piezoelectric motor 1 that drives the rotation of the paper supply roller 111 is transmitted to the discharge roller 121.

Although the paper supply unit 110 and the discharge unit 120 are rotationally driven by the piezoelectric motor 1 in the example shown in FIG. 9 and FIG. 10, it should be noted that, for example, a driving motor 107 that moves the carriage 104 may be used instead of the piezoelectric motor 1 according to the aforementioned embodiments. Of course, the piezoelectric motor 1 may be used in other driving systems such as, for example, a pump or the like that supplies ink to the ink jet recording head 101.

The invention is aimed generally at all types of liquid ejecting apparatuses, and the piezoelectric motor may be applied in liquid ejecting apparatuses aside from the aforementioned ink jet recording apparatuses. For example, a coloring material ejection apparatus used in the manufacture of color filters for liquid crystal displays and the like, electrode material ejecting apparatuses used for forming electrodes in organic EL displays, FEDs (field emission displays), and so on, and bioorganic compound ejection apparatuses used in the manufacture of biochips may be given as examples of other types of liquid ejecting apparatuses.

Furthermore, the piezoelectric motor 1 according to the aforementioned embodiments may also be used as a driving unit for a clock. An example of a clock that uses the piezoelectric motor 1 of the first embodiment is illustrated in FIG. 11.

Figure 11:
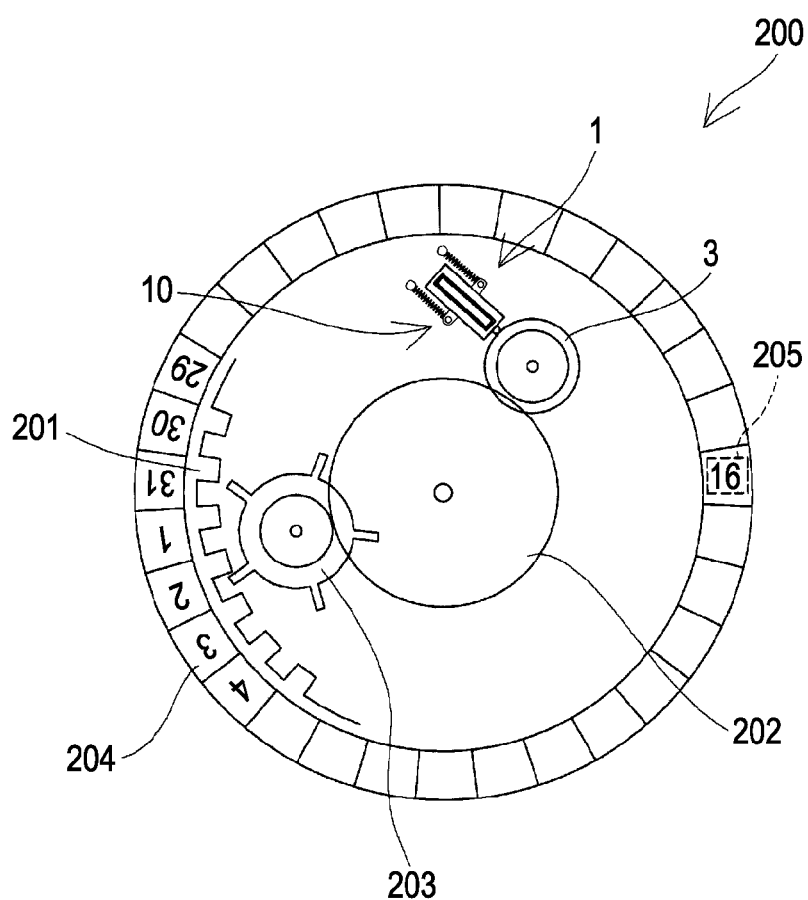
FIG. 11 is a plan view of a clock according to an embodiment of the invention.

As shown in FIG. 11, a calendar display mechanism of which a clock 200 is configured is connected to the piezoelectric motor 1, and is driven by the driving force thereof.

A reduction train wheel that decelerates the rotation of the rotational shaft 3 of the piezoelectric motor 1 and a ring-shaped date wheel 201 are provided as the primary constituent elements of the calendar display mechanism. The reduction train wheel includes a date indicator driving intermediate wheel 202 and a date indicator driving wheel 203.

When the rotational shaft 3 is rotationally driven in the clockwise direction by the piezoelectric actuator 10 of the aforementioned piezoelectric motor 1, the rotation of the rotational shaft 3 is transmitted to the date indicator driving wheel 203 via the date indicator driving intermediate wheel 202, and the date indicator driving wheel 203 causes the date wheel 201 to be rotated in the clockwise direction. The transmission of force from the piezoelectric actuator 10 to the rotational shaft 3, from the rotational shaft 3 to the reduction train wheel (date indicator driving intermediate wheel 202 and date indicator driving wheel 203), and from the reduction train wheel to the date wheel 201 are all carried out in the planar direction. For this reason, the width of the calendar display mechanism may be reduced.

Meanwhile, a disk-shaped character plate 204 on which characters indicating days of the month are written in the circumferential direction is anchored to the date wheel 201. A window portion 205 exposing one of the characters provided on the character plate 204 is provided in the main body of the clock 200, so that the day of the month may be seen through the window portion 205. Although not shown in FIG. 11, it should be noted that the clock 200 is also provided with a long hand, a short hand, a movement for driving the long and short hands, and so on.

Note that the piezoelectric motor 1 may be used not only for the calendar display mechanism but also for the movement that drives the long and short hands of the clock. With respect to the mechanism that drives the long and short hands of the clock, the aforementioned piezoelectric motor 1 may be incorporated into the clock rather than past known electromagnetic motors or the like.

The invention is generally aimed at all types of piezoelectric motors, and may be used in miniature devices aside from the aforementioned liquid ejecting apparatus and clock. Medical pumps, cameras, industrial robots, artificial arms, and so on may be given as examples of miniature devices in which the piezoelectric motor may be used.

What is claimed is:

1. A piezoelectric motor comprising:
    a piezoelectric element including a piezoelectric layer, a first electrode, and a second electrode; the first electrode formed on one side of the piezoelectric layer; and the second electrode formed on the other side of the piezoelectric layer;
    a vibrating member anchored to the first electrode of the piezoelectric element; and
    a rotational shaft with which the vibrating member makes contact and is rotated thereby,
    wherein the piezoelectric layer includes a longitudinal vibration excitation region and four bending vibration excitation regions, the bending vibration excitation regions being disposed on either side of the longitudinal vibration excitation region so that two opposing diagonal pairs of the bending vibration excitation regions are formed; and
    a polarization direction of one of the opposing diagonal pairs of the bending vibration excitation regions in the piezoelectric layer is fixed and inverted relative to the other opposing diagonal pair of the bending vibration excitation regions.

2. The piezoelectric motor according to claim 1, wherein the second electrode includes a bending vibration electrode portion linking the bending vibration excitation regions, and a longitudinal vibration electrode portion provided on the longitudinal vibration excitation region.

3. The piezoelectric motor according to claim 2, wherein the bending vibration electrode portion is linked at its ends in the lengthwise direction of the piezoelectric element.

4. The piezoelectric motor according to claim 2, further comprising:
    a signal generation unit that generates and outputs a longitudinal driving signal of a predetermined frequency, the longitudinal driving signal being applied to the longitudinal vibration electrode portion of the second electrode; and
    a phase shifter receiving the longitudinal driving signal from the signal generation unit and outputting a bending vibration driving signal that is applied to the bending vibration electrode portion of the second electrode, the phase shifter receiving the longitudinal driving signal and outputting the bending vibration driving signal having a phase shifted from a phase of the longitudinal driving signal by approximately 90 degrees.

5. The piezoelectric motor according to claim 4, further comprising a switching signal source that outputs a switching signal to the phase shifter, the phase shifter being configured to selectively generate the bending vibration driving signal so as to have a phase that is delayed by 90 degrees relative to the longitudinal driving signal and the bending vibration driving signal so as to have a phase that is advanced by 90 degrees relative to the longitudinal driving signal in response to the switching signal.

6. A medical pump comprising the piezoelectric motor according to claim 1.

7. A robot comprising the piezoelectric motor according to claim 1.

8. An artificial arm comprising the piezoelectric motor according to claim 1.

9. The piezoelectric motor according to claim 1, wherein the first electrode is electrically coupled with each of the four bending vibration regions and the longitudinal vibration region.

10. A piezoelectric motor comprising:
    a piezoelectric element including a piezoelectric layer, a first electrode, and a second electrode; the first electrode formed on one side of the piezoelectric layer; and the second electrode formed on the other side of the piezoelectric layer;
    a vibrating member anchored to the first electrode of the piezoelectric element; and
    a rotational shaft with which the vibrating member makes contact and is rotated thereby,
    wherein the piezoelectric layer includes a longitudinal vibration excitation region and four bending vibration excitation regions, the bending vibration excitation regions being disposed on either side of the longitudinal vibration excitation region so that two opposing diagonal pairs of the bending vibration excitation regions are formed; and
    a polarization direction of one of the opposing diagonal pairs of the bending vibration excitation regions in the piezoelectric layer is fixed and inverted relative to the other opposing diagonal pair of the bending vibration excitation regions wherein the first electrode includes a first polarization electrode portion and a second polarization electrode portion divided into regions of the piezoelectric layer of which polarization directions are different to each other, and provided so as to be electrically conductive with those regions.

11. The piezoelectric motor according to claim 10, wherein the second polarization electrode portion includes two diagonally opposed regions disposed on opposite sides of the longitudinal vibration excitation region.

12. The piezoelectric motor according to claim 11, wherein the two diagonally opposed regions of the second polarization electrode portion are linked so as to electrically couple the two opposed regions of the second polarization electrode portion.

13. The piezoelectric motor of claim 10 wherein the polarization channels are separate from each other and the electrode portion in the planar direction.

* * * * *